United States Patent [19]

Liljenwall et al.

[11] 4,139,837
[45] Feb. 13, 1979

[54] INFORMATION ENTRY SYSTEM

[75] Inventors: James Liljenwall; David Moss, both of Berkeley, Calif.

[73] Assignee: Creative Ventures, Inc., Dayton, Ohio

[21] Appl. No.: 808,782

[22] Filed: Jun. 22, 1977

[51] Int. Cl.² ............................ G06K 9/10; G06F 7/38
[52] U.S. Cl. .......................... 340/146.3 SY; 58/152 R; 364/705; 364/709
[58] Field of Search ............ 340/146.3 SY, 146.3 SG, 340/146.3 R, 365 C, 365 S, 365 A, 365 R, 324 R, 324 M; 178/18, 19; 364/705, 709; 58/152 R

[56] References Cited

U.S. PATENT DOCUMENTS

| | | | |
|---|---|---|---|
| 3,563,097 | 2/1971 | Roggenstein et al. | 340/146.3 SY |
| 3,653,031 | 3/1972 | Hlady et al. | 178/18 |
| 3,704,343 | 11/1972 | Howard | 178/18 |
| 3,757,322 | 9/1973 | Barkan et al. | 178/18 |
| 3,877,029 | 4/1975 | Larson et al. | 340/365 C |
| 4,005,400 | 1/1977 | Engdahl | 340/146.3 SY |
| 4,027,306 | 5/1977 | Hackmeister | 340/365 S |
| 4,047,010 | 9/1977 | Perotto et al. | 364/705 |
| 4,055,755 | 10/1977 | Nakamura et al. | 340/365 C |
| 4,071,691 | 1/1978 | Pepper, Jr. | 340/365 C |

*Primary Examiner*—Leo H. Boudreau
*Attorney, Agent, or Firm*—Biebel, French & Nauman

[57] ABSTRACT

A manual information entry device comprises a multi-segment face including electrically isolated adjacent surfaces presenting a bounded face within which characters and signs are traced by a human finger. Each of the surfaces or segments has an associated sensor operative to produce a different output state when the surface is touched and when it is not touched. Encoding logic devices are connected to each of the sensors and operate to generate information codes corresponding to the first and last touched segments in a given trace. The device may be worn by the user, and may include calculating and time circuits which make up a wristwatch/calculator. Contact between the watch case, or a part thereon, and the body of the wearer may be utilized as part of the touch sensing circuits.

17 Claims, 9 Drawing Figures

FIG-4

○ = START OF STROKE
● = END OF STROKE OR TOUCH

FIG-8

WATCH

DISPLAY TIME   SET TIME   DISPLAY DATE   SET DATE   GO TO CALCULATOR

CALCULATOR

ENTER | CLEAR LAST DIGIT | CLEAR DISPLAY | CHANGE SIGN OF EXP. | CHANGE SIGN OF MANT. | GO TO SCI. FNCTN. | GO TO INVERSE SCI. FNCTN. | GO TO CONTROL FNCTN.

SCIENTIFIC FUNCTIONS

SIN | COS | TAN | LOG | IN | $\sqrt{X}$ | $\pi$
ARCSIN | ARCCOS | ARCTAN | $10^X$ | $c^X$ | $X^Y$ | $1/X$

CONTROL FUNCTIONS

STORE   RECALL   ROLL ↓   ROLL ↑   ENTER EXP.   GO TO WATCH

FIG-9

INFORMATION ENTRY SYSTEM

BACKGROUND OF THE INVENTION

This invention relates to systems for the human entry of information, especially by finger touch, into information processing devices. U.S. Pat. No. 3,903,502, assigned to the assignee of this application, discloses a system wherein the user enters information by the act of tracing paths over a cell or cells, and each path possesses certain characteristics, namely, the beginning and/or end points (or termini) specific to the information being entered. These characteristics are used to encode characters (numerical and/or alphabetical).

Other systems exist, and other proposals for systems have been made, to permit a large reduction in the space which conventional keyboards require for information entry. All, however, suffer from defects of practicality. Miniature keyboards, too small for fingertip operation, and a special stylus, are inconvenient and unnatural in use and become inoperable when the stylus is lost. They tend also to be delicate and expensive. Directionally sensitive multiple-function keys are inconvenient and unnatural as well. Multiple keystroke entry methods are especially cumbersome and unreliable for the entry of numerical data. In general, as the space required for these systems diminishes, so also do their naturalness and reliability.

Other information entry systems using scribing-sensing methods, are shown in U.S. Pat. Nos. 3,108,254 (Dimond) and 3,142,039 (Irland et al), or manually interrupting optical paths as in Burkhart 3,234,512.

Thus, although there has been substantial activity in this field, there still exists the need for an information entry system that demands so little space as to permit the successful development of such devices as wristwatch size electronic calculators with an inexpensive, yet natural and reliable information entry system.

SUMMARY OF THE INVENTION

The present invention employs the definition of characters by their termini, in the manner of U.S. Pat. No. 3,903,502, but for a new purpose, namely the replacement of such conventional information entry systems as a keyboard. The invention is particularly useful in devices requiring an exceptionally compact finger actuated information entry system, devices such as a wristwatch size electronic calculator.

Thus, the invention makes use of those principles of character recording systems but using traces or strokes of just one or two fingers, confined to a single, fixed area of the device called the face, and no scribing members need be employed. No mark is left upon the face, rather the strokes across it are made preferably by the unaided human finger, although a non-marking scribe member could be used provided it has the necessary characteristics to cause the same response as human touch.

The present invention provides a method and system, including related electronic equipment, whereby a user of a device embodying them can enter information into information processing machines simply by the act of making these finger strokes across the face. These strokes need to be constrained only to the extent of having the positions of their termini defined for each piece of information to be entered. For instance, in one embodiment of the invention, to enter the digit "2" the user traces or makes a stroke across a face divided into three zones or segments, left, middle, and right, taking care only to begin the stroke in the left zone and to end it in the right, before lifting the finger. This can be done by tracing the digit "2" on the face or by a shorthand stroke starting in the left zone and ending in the right zone. As explained in detail hereafter, this simple scheme permits the definition and entry of all the digits and instructions needed for a simple electronic calculator and watch, using only three proximate sensing zones or segments which total in area the approximate size of a wristwatch, for example about 250 mm by 250 mm. Other schemes using different arrangements of sensing elements are also described to permit information entry in more complex or other devices. Furthermore, this invention can readily be used in conjunction with other means of information entry to suit an even greater variety of uses.

The invention also utilizes the fact that the case of a watch or other worn calculator device is in contact with the skin of the user when operative. For example, the wristwatch calculator is strapped to the wrist of the person making entry strokes on the face with his finger. Therefore, the invention utilizes the body of the user as part of the information entry circuitry, thereby minimizing extraneous or accidental entries.

The primary object of the invention is thus to provide novel, simplified means of touch entry of information and/or instructions to a device or system, using sensing mechanisms in a face which is only a fraction of the size of presently used keyboards, dials, etc., but has comparable information handling capacity, and to provide an information entry scheme and system which is much smaller, yet compatible to existing calculator chips and other devices.

The apparatus may take different forms in accordance with this invention, but the preferred embodiment disclosed hereafter is believed to be the most useful embodiment from the standpoint of simplicity, ease of manufacture, ease of information entry and overall adaptability.

Other objects and advantages of the invention will be apparent from the following description, the accompanying drawings and the appended claims.

DESCRIPTION OF THE PREFERRED EMBODIMENT

Figure 1:
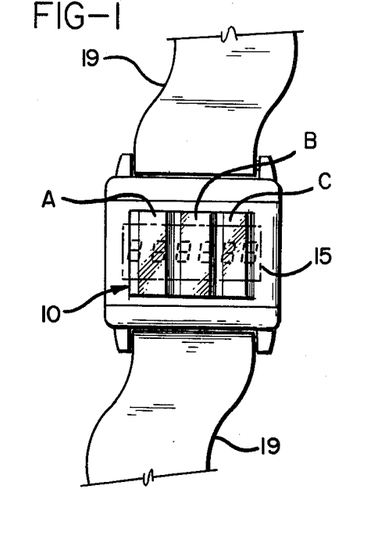
FIG. 1 is a front view of the body of a combination wristwatch calculator using the invention, showing the arrangement of three sensing segments or zones and the display.
Figure 2:
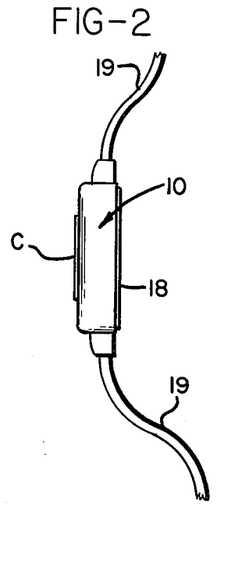
FIG. 2 is a side view of the body.
Figures 3, 7:
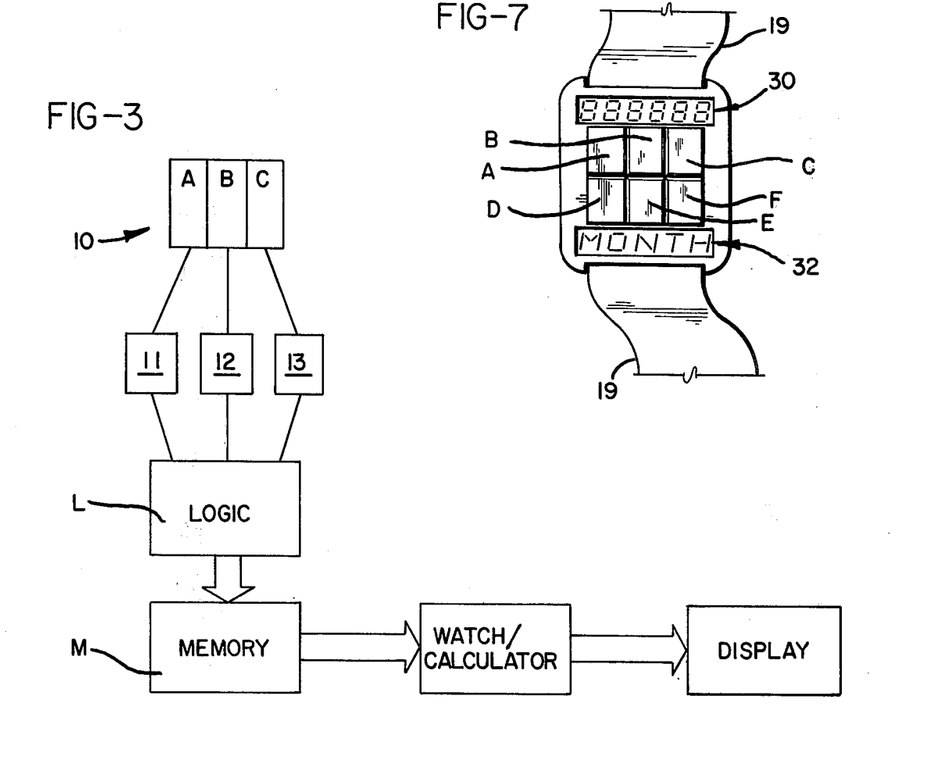
FIG. 3 is a block diagram of the device.
FIGS. 7 and 8 show a more complex system using a six segment entry face, as for a watch/scientific calculator.

Referring to FIG. 1, the body of a combination wristwatch calculator using this invention is shown in front view. The face 10 of this body (corresponding to the crystal of a digital watch) is divided into three proximate segments or zones A, B and C which control electronic switches in the circuits 11, 12 and 13, respectively (FIG. 3). When the user's finger contacts or is proximate to any zone, the switch controlled by it is closed. When no finger contact is made, the switch is open. These switches are omitted from the logic part of the diagram in FIG. 4, for the sake of simplification.

The illuminated digits of the display 15, which may be typically known as L.E.D. or liquid crystal displays, can be mounted beneath segments A, B, and C if these are made of a light transmitting material. No other switches or controls are necessary for a typical four function calculator and watch. All digits and instructions are entered into the device by touching the segments as hereafter explained. The segments need not overlie the display, but may be placed above, below, or to one side of the display, but in any event the segments should be large enough and close enough together to allow comfortable use with an average size human fingertip.

Figure 4:
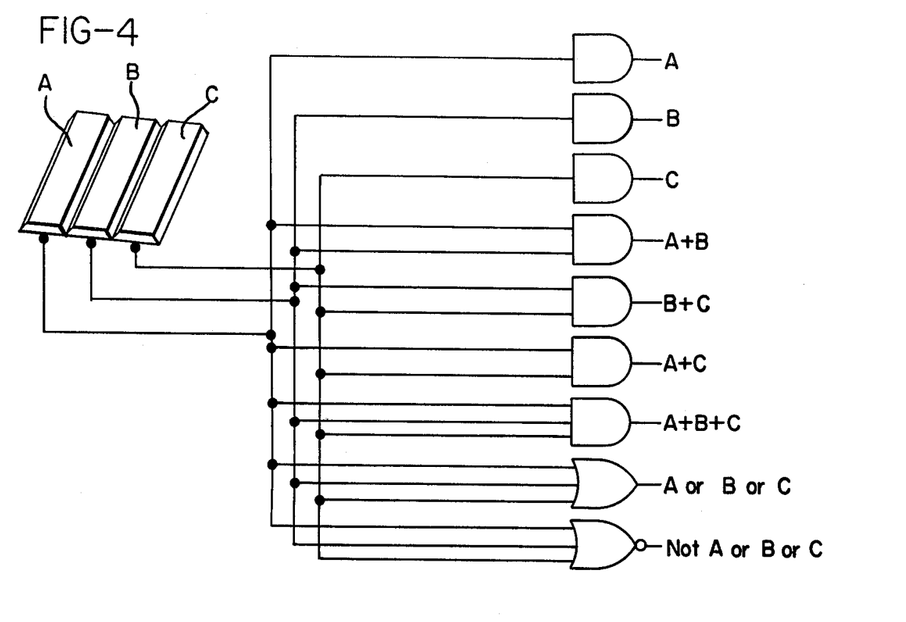
FIG. 4 is a diagram of a three-segment entry arrangement.

As shown in FIG. 4, the adjacent edges of the segments may be separated by being chamfered (A', B', C'). The segments may also be slightly separated to the touch by being contoured overall, as by mounting on a convex surface or making segment B slightly raised with respect to segments A and C. Division to the touch can also be provided by electrically neutral blades separating the segments and rising slightly above the segment surfaces, or by having different segments with different texture to touch, or other tactile indicators.

The three segment system preferably operates in two modes (I and II) for dual usage of entry strokes. Mode I is used for entry of digits, decimal point, and function; Mode II is used for entry of instructions, and also look-up information when used with a calculator having scientific capability, such as trig and log data.

The first mode, employing the stroke termini principle, is used for the entry of digits. The user brings a finger into contact with the face 10, traces a path over the face while maintaining contact, then removes the finger from contact. For entering the digits 0 through 9, the combination of, (a) the segment on which *first* contact with the face is made, (b) the segment on which *last* contact is made, and (c) whether other segments were touched if the first and last touched are the same, determine the digit entered into the device. The common contact or plate 18 on the back of the body is held against the skin of the user when the body is attached, as to the wrist of a user, by a strap or band 19. Thus, a circuit is completed when a finger touches segment A, for example, and additional circuits are completed as the finger stroke progresses, all through the body of the user. Alternatively, the segments may be of a capacitive type which triggers the associated switch circuit in response to touch. The first and last circuit completions are significant, representing the location of the termini of the finger trace or stroke on the face.

Since the termini of the strokes determine the digit entered, the user is given considerable latitude in forming the strokes. When the digit segment codes are appropriately chosen, therefore, the strokes can follow the user's natural strokes for writing the digits by hand. The system thus requires only a little learning. The following table represents Mode I and Mode II entries in a typical scheme. In the table, notation XX means the finger touches only one segment in completing a stroke; X/X means the finger must leave a segment and return to that segment; $\overline{XY}$ means two segments are touched simultaneously. In FIG. 4, to illustrate the system along with encoding logic, the start of a stroke or trace is indicated by a circle, and the end of the trace by a dot.

| | | MODE I | |
|---|---|---|---|
| 0 = B/B | 5 = CA | + = AA | Change Mode** = $\overline{ABC}$ |
| 1 = BB | 6 = BA | − = CC | |
| 2 = AC | 7 = AB | × = $\overline{AB}$ | |
| 3 = A/A | 8 = C/C | ÷ = $\overline{BC}$ | |
| 4 = BC | 9 = CB | . = $\overline{AC}$ | |
| | | MODE II | |
| display time | | = AA | sin = CA |
| display date | | = CC | cos = C/C |
| start time | | = $\overline{AB}$* | tan = BC |
| start date | | = $\overline{BC}$* | log = AC |
| clear last entry | | = BB | ln = AB |
| clear display | | = B/B | π = A/A |
| clear machine | | = BA | ×Y = CB |
| f⁻¹ | | = $\overline{AC}$ | |

*To set time or date, the calculator is put in Mode I particular time or date is entered as XX.XX.XX. The presence of two decimal places tells the logic to save this number and switch to Mode II. Then this new time or date is entered when the user strokes in $\overline{AB}$ or $\overline{BC}$.
**Machine reverts to Mode I automatically except after AA, CC, $\overline{AB}$, $\overline{BC}$.

A block diagram for the device is shown in FIG. 3. Assuming the device is initially in the calculator rest state and all switch circuits 11, 12, and 13 are open, when any of these circuits is first closed, i.e., when the user first touches a finger to the device face, the encoding logic circuits L detect the event and store a corresponding identification code in a first register of the memory M. Subsequent circuit closings cause identification codes to be stored in a second register of memory M, with these continually being updated or substituted, so as to retain the code corresponding to the last touched segment in the second register. When the user lifts all his fingers from the face, the logic then senses completion of the entry stroke, and the codes temporarily in the registers are used to look up in the memory an eight bit address code which is used to instruct (enter) the calculator and watch circuits, as appropriate. This address code assignment may contain eight bits, for example, in which one bit expresses which mode the device is in.

For example, if the user makes an "enter 2" stroke (as in FIG. 4, panel 2) beginning in segment A and ending in segment C, the logic determines from the time relations of the openings and closings of circuits 11, 12, and 13 that the segments have been touched succesively; there are codes entered in both the aforementioned first and second registers. The resulting binary code is used to address the memory M and cause it to load the appropriate information for number 2 into the calculator and to display that number.

Next, if the user makes an "enter 1" stroke, only segment B is touched, the logic places an identification code only in the first register, and there is no entry into the second register before the stroke is completed. The resulting look up produces the address code for numeral 1 from the memory.

However, if the user makes an "enter 0" stroke, the identification codes for segment B are placed in both registers, and the resulting look up produces the address code for numeral 0 from the memory.

Suppose the user next makes the "multiply" stroke, simultaneously touching zones A and B. The logic determines that the zones have in fact been touched simultaneously, not successively, and places in the first register the code for identifying multiplication. Again, this code the logic uses to look up in memory M the address code for machine instructions for performing multiplication.

Figure 5:
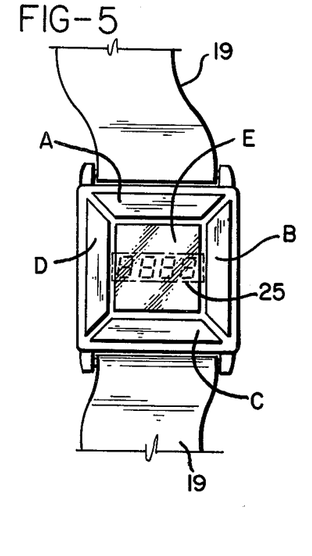
FIGS. 5 and 6 show a system with a five segment entry face, as for a watch/calculator.
Figure 6:
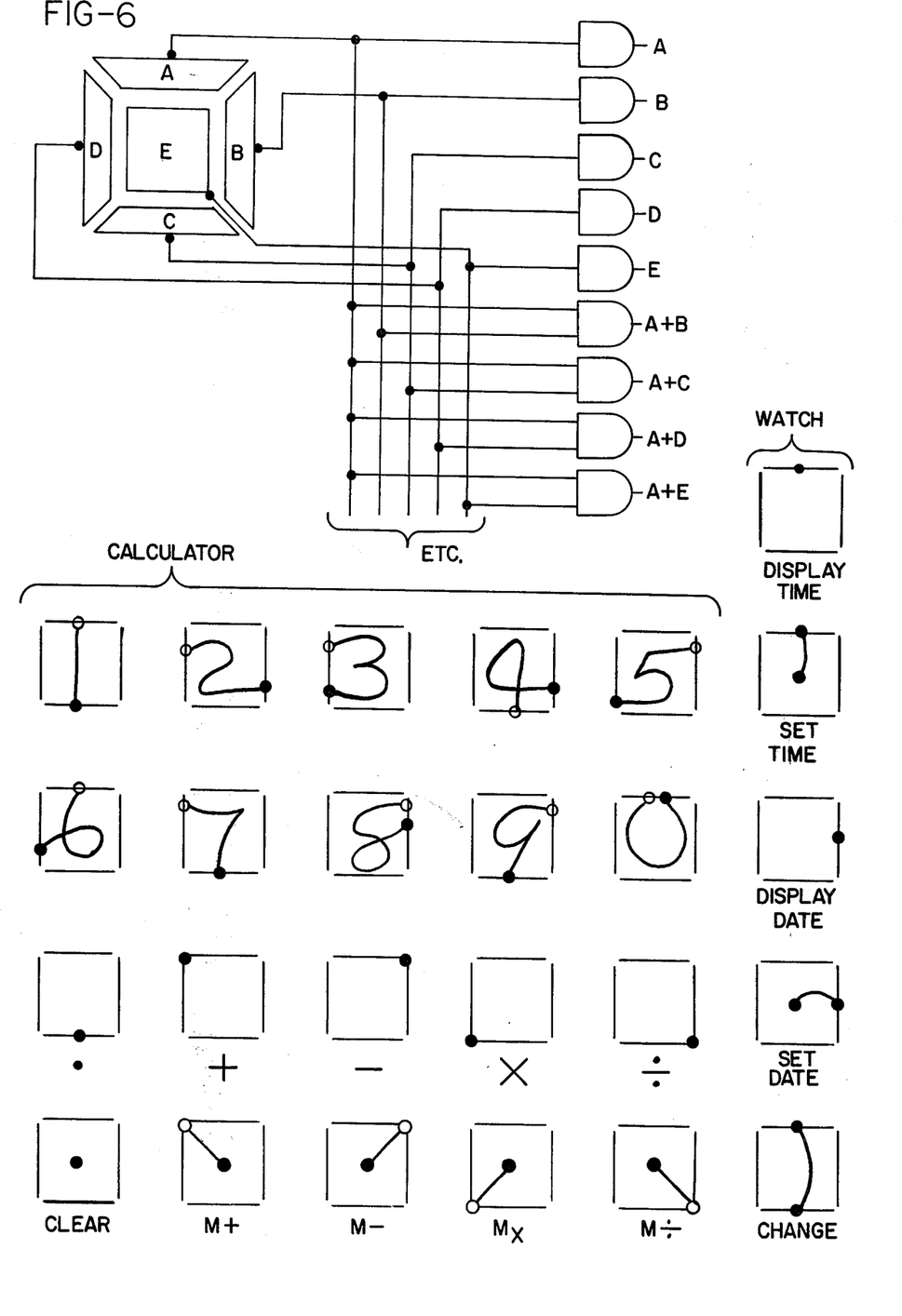

FIGS. 5 and 6 illustrate another embodiment of the invention which may be used, for example, in a watch-/calculator unit of the type having a four function calculator with memory. Here, the segments of the entry device, designated A, B, C, D and E, are arranged with one segment central and the other four segments proximate, but separated from each other and from the central section. As shown in FIG. 5, the central segment E is of a suitable transparent material since it overlies the display 25.

FIG. 6 shows the five segment entry arrangement together with an illustrative part of the corresponding logic network, together with 26 panels which illustrate the code arrangement used for entry of numerals and instructions with the five segment entry system. Again, a circle represents the beginning of a stroke, and a dot represents the end of a stroke. The central segment is omitted in the panels, but is understood to be represented by the center of the panel surrounded by the four outer lines. Dots joined by a curved line, or dots located at a corner touching two segments, represent simultaneous touching of two segments for entry purposes.

The first five columns of panels reading from left to right under the heading "calculator," represent the strokes necessary to enter 10 digits, a decimal point, four algebraic functions, and four functions associated with the memory, together with a "clear" function. The fifth or righthand column, designates the four code arrangements required to set and display time and/or date, these being associated with the watch function of the unit. The panel in the lower right corner, indicating simultaneous touching of segments A and C, represents the entry of a code to produce an address to change the function of the unit from whatever it is in. In other words, if the unit is in calculator function, the change entry will set the unit to the watch function, and vice versa.

It is possible to achieve sufficient capacity in this five segment entry system such that no two entry strokes or touches are the same, and the dual mode operation previously described in connection with FIGS. 1, 3, and 4 is not required. However, as will be apparent to those skilled in the art, the logic is somewhat more complex, since it requires discrimination between inputs from five different segments and various combinations of these instead of three. Only an illustrative portion of the logic is shown in FIG. 6, since it will be apparent that the remainder of the logic is a straight forward progression of combinations of inputs from the various segments.

Figure 8:
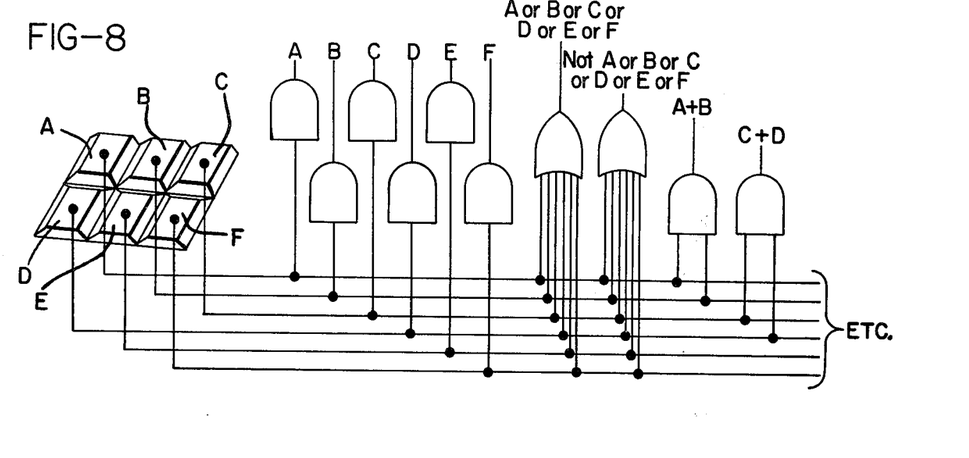

FIGS. 7 and 8 discloses a more complex six segment dual mode entry system, in which the display 30 is located above the entry face. This face comprises six segments A, B, C, D, E, and F. Beneath this face is a second display 32. Display 30 shows digits, as in a normal watch or calculator, and display 32 shows letters indicating the month in the watch mode, or indicating the last function or operation performed in the calculator mode.

Referring to FIG. 8 the segment of the decoding logic shown at the top of the figure is illustrative of the decoding gate arrangement used to enter information, from touches and/or strokes to the six segment face, as entry codes in the registers which in turn address the memory. The remainder of the decoding logic is an apparent progression of combinations to those skilled in such art.

Under the caption "watch" in FIG. 8 there are four panels. These describe the touches for the six segment arrangement used to address and instruct the watch part of the unit in order to set and/or display time or date. The fifth panel shows the stroke for the entry which produces instruction to go to the calculator mode.

Under the caption "calculator" there are three rows of panels showing the entry strokes for the 10 digits, the four normal algebraic functions and a decimal point, and in addition instructions for an inverting function. The lowest row shows codes for producing an enter function, the functions to clear either the last digit entered or the entire display, functions causing a change sign of an exponent or change sign of a mantissa, instructions to go to the scientific functions illustrated below (either in normal or inverse fashion) and an instruction to go to the control functions shown at the bottom of the figure. The strokes for encoding the scientific functions, both direct and inverse, are believed self explanatory, as well as the stroke entries shown under the caption "control functions" at the bottom of the sheet.

Figure 9:
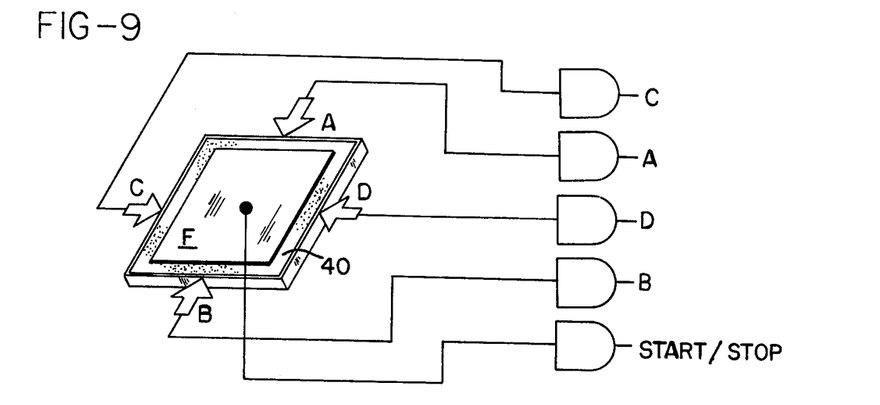
FIG. 9 shows another form of entry system using force sensors operated by a face moving within constraints.

FIG. 9 shows an embodiment using a single face plate F which is mounted in a surrounding constraint 40. This may be a resilient member, or members, which allows limited movement of plate F in response to movement of the fingertip over the plate surface. Thus, as a stroke is made to the right, the plate will tend to move that way, and the sensor D will respond, providing an output through the appropriate encoding gate circuit.

Initial contact with plate F will produce an enabling signal from the START/STOP gate. In the same manner as described in connection with the FIG. 4 embodiment, the first part (or force vector) of the stroke will be entered in one register, and the last part (or force vector) will be entered in a second register. The following table gives the encoding for digits 0–9, using this system:

1 = BB
2 = DD
3 = DC
4 = AD
5 = CC
6 = BC
7 = DB
8 = CD or CA
9 = CB
0 = BA

Thus, for example, the trace for numeral "2" begins with the stroke proceeding to the left and actuating sensor D, and ends with the stroke and proceeding left. The actual tracing motion of the finger can be rather slight, and the constraint can be such as to limit plate movement to a very small amount, and still achieve sensor actuation sufficient for encoding.

It will be noted that the various embodiments of this invention, as described above, employ portions of character reading and/or encoding systems disclosed in U.S. Pat. No. 3,903,502. The present invention is thus well suited to be used in conjunction with other devices embodying such systems since the device logic of that system is already present. For example, a wristwatch calculator using the present invention can be constructed to accept signals from the detecting or sensing part, such as a combination of a pen, a special recording medium, or an underlay, overlay or templet, of the systems disclosed in the aforementioned patent. It is thus possible to develop a system wherein the wristwatch calculator operates in conjunction with written characters recorded in one or more cells on a medium, such as a check book, and the calculator of the unit can be used to perform appropriate operation on the entered or traced numbers, and to display the required answers. Stated another way, it is possible to utilize a writing scribe member, such as shown in U.S. Pat. No. 3,903,502 as an alternate entry system to the three segment entry arrangement in particular (as shown in FIG. 4), so that entries into the calculator unit can be made either from the face through appropriate finger strokes, or through the writing scriber.

While the method and forms of apparatus herein described constitute preferred embodiments of the invention, it is to be understood that the invention is not limited to this precise method and forms of apparatus, and that changes maybe made therein without departing from the scope of the invention which is defined in the appended claims.

What is claimed is:

1. The method of manually entering information into an information processing device, comprising the steps of
   (a) providing a sensing member having a face and capable of sensing the direction of strokes made on said face by a human finger;
   (b) assigning direction codes to pieces of information to be entered based upon the first and last stroke directions;
   (c) making a finger stroke on the surface of the face in accordance with said assignment; and
   (d) translating sensed stroke directions into a form usable by the processing device.

2. The method of claim 1, wherein step (c) includes strokes made in a form natural to the user for the hand writing of the information to be entered.

3. The method of manually entering information into an information processing device, comprising the steps of
   (a) providing a face divided into adjacent segments and capable of sensing the location of strokes made on said face by a human finger touching one or more of the segments;
   (b) assigning segment location codes to pieces of information to be entered;
   (c) making a finger stroke or contact on one or more of the segments of the surface in accordance with said assignment; and
   (d) translating sensed segment locations for only the first and last segments touched into information codes usable by the processing device.

4. The method of claim 3, wherein step (c) includes strokes made in a form natural to the user for the hand writing of the information to be entered.

5. The method of claim 3, wherein step (b) includes the assignment of codes based upon the first and last segments touched.

6. An information entry device, comprising
   a face member presenting a surface on which characters are to be traced,
   constraint means supporting said face member for limited motion in directions parallel to said surface in response to the tracing action thereon;
   a plurality of sensors mounted around the periphery of said face member to respond to limited movements of said face member resulting from different force vectors exerted on said face member during tracing, and
   encoding means connected to said sensors and operative to produce character identification codes unique to the actuation of said sensors resulting from tracing of different characters on said face member.

7. An information entry device comprising
   a multi-segment face including electrically isolated adjacent surfaces presenting a bounded face within which characters and signs are traced by a human finger,
   each of said surfaces having an associated sensor operative to produce a different output state when it is touched and when it is not touched, and
   encoding means connected to each of said sensors and operative in response to the first and last touched segments in a given trace or if the first and last touched segments are the same, then those segments together with whether any other sensor was touched between the first and last, to generate unique information codes for a complete set of the characters and signs.

8. A device for entering information into an information processing apparatus, comprising
   means forming an entry face on which entry strokes are made by a finger of a user touching said face,
   means sensing the termini of the finger strokes on said face, and
   encoding means connected to said sensing means and operative to generate discrete information codes for different characters and other information,
   said encoding means including logic circuits responsive during each touch or stroke on said face only to
   (a) the location on said face first touched by the finger,
   (b) the location on said face where the finger withdraws from the face, or
   (c) if those locations are the same, then those locations together with whether the finger touched any other location on said face prior to withdrawal.

9. A device as described in claim 8, wherein said face is segmented to include a plurality of touch responsive contact members adjacent each other, said contact members being connected to complete discrete entry circuits to said encoding means.

10. A device as described in claim 9, wherein said segment contact members are provided with means which distinguish them from each other by touch.

11. A device as described in claim 8, including direction sensing means operative by said face to sense the vectors of force transmitted to said face by the finger in accomplishing the strokes.

12. A device as described in claim 11, wherein said face is a unitary member, and said direction sensing means are mounted around the periphery of said unitary member.

13. A device for translating finger strokes into signals defining characters, comprising
   means providing an entry surface on which different finger strokes can be traced over an entry face,
   a plurality of sensors incorporated in said face according to a predetermined pattern and each capable of generating a signal in response to placement of a finger into operative relation therewith,
   said sensors providing a sequence of signals as a finger traces over said face, encoding means separately connected to each of said sensors, and said encoding means including logic circuits responsive during each stroke on said entry surface only to signals from
  (a) those sensors which the finger first touches and last touches as the finger withdraws from said face, or
  (b) if said sensors are the same, then said sensors together with whether any other sensors were touched between the first and last touched, whereby said encoding means utilizes as information only the locations of the termini of finger strokes on said face.

14. A device as defined in claim 13 including a first contact arranged to engage the skin of a user to provide a common switching circuit path, said sensors including second contacts arranged to be touched selectively by the scribing finger of the user, and
  said contacts being connected to said encoding means to complete different circuits as the finger is moved over said face.

15. In a calculator having a case with a digital numerical display,
  a device for translating finger strokes into signals defining characters including
  an entry surface on said case having an entry face on which different finger strokes can be traced,
  a plurality of independent sensors incorporated in said face according to a predetermined pattern and each capable of generating a signal in response to placement of a finger into operative relation therewith,
  said sensors providing a sequence of signals as a finger traces over said face,
  encoding means separately connected to each of said sensors and adapted to provide an output for said display,
  and said encoding means including logic circuits responsive only to signals from those sensors which the finger first touches and from which the finger withdraws from said face, or if those sensors are the same, then those sensors together with whether any other sensors were touched after the first, whereby said encoding means utilizes as information only the locations of the termini of finger strokes on said face.

16. A calculator as defined in claim 15, including
  a memory having registers for storing identification of the first touched and last touched sensors and also having stored address codes for a set of characters and functions which can be looked up and utilized according to the information in said registers after the finger is withdrawn from said face.

17. A calculator as defined in claim 15, including
  a first contact on said case adapted to remain in contact with the skin of the user during use of the device,
  and said encoding means being connected to said contact and to said face to respond to completion of an electrical circuit from said first contact through the body of the user to said face.

* * * * *